(12) United States Patent
Namose (10) Patent No.: US 6,838,011 B2
(45) Date of Patent: Jan. 4, 2005

(54) METHOD OF PROCESSING PFC AND APPARATUS FOR PROCESSING PFC

(75) Inventor: Isamu Namose, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 307 days.

(21) Appl. No.: 09/805,382

(22) Filed: Mar. 13, 2001

(65) Prior Publication Data

US 2002/0033377 A1 Mar. 21, 2002

(30) Foreign Application Priority Data

Mar. 13, 2000 (JP) ........................................ 2000-069404

(51) Int. Cl.$^7$ ............................ C23F 1/100; H05H 1/00
(52) U.S. Cl. ................ 216/67; 156/345.35; 156/345.1; 118/715
(58) Field of Search ........................ 156/345.35, 345.1, 156/345.29, 914, 915; 118/715; 216/67; 134/1.1

(56) References Cited

U.S. PATENT DOCUMENTS

| | | | |
|---|---|---|---|
| 5,013,338 A | * 5/1991 | Anand et al. | .................... 96/4 |
| 5,439,568 A | 8/1995 | Uchiyama | .................. 204/164 |
| 5,569,810 A | 10/1996 | Tsuji | .......................... 588/227 |
| 5,750,823 A | 5/1998 | Wofford et al. | |
| 5,965,786 A | 10/1999 | Rostaing et al. | ............ 588/210 |
| 5,993,612 A | 11/1999 | Rostaing et al. | |
| 6,045,618 A | * 4/2000 | Raoux et al. | ............... 118/715 |

FOREIGN PATENT DOCUMENTS

| | | |
|---|---|---|
| EP | 0602510 | 6/1994 |
| EP | 0820801 | 1/1998 |
| FR | 2751565 | 1/1998 |
| GB | 149089 | 8/1920 |
| JP | 6182140 | 7/1994 |
| JP | 8024560 | 1/1996 |
| JP | 10165753 | 6/1998 |
| JP | 2001054721 | 2/2001 |

OTHER PUBLICATIONS

PCT International Search Report for Appl. No. PCT/JP01/01794 dated May 22, 2001.
European search report for European Patent Application No. 01912170.6 dated Feb. 16, 2004.

* cited by examiner

*Primary Examiner*—Parviz Hassanzadeh
(74) *Attorney, Agent, or Firm*—Konrad Raynes & Victor, LLP; Alan S. Raynes (57) ABSTRACT

The present invention relates to a method and an apparatus for processing PFC, which does not damage a vacuum pump, and in which maintenance and inspection works are readily performed, and an incineration process is not required. The processing apparatus 10 is constructed with a vacuum chamber 12, and a vacuum pump 16, a reaction gas introduction section 17, a plasma process section 18 and a polymer collection section 20 that are successively disposed through a piping 14 in a succeeding stage of the vacuum chamber 12.

20 Claims, 4 Drawing Sheets

Fig. 1

10 : Processing apparatus
12 : Vacuum chamber
16 : Vacuum pump
18: Plasma processing section

METHOD OF PROCESSING PFC AND APPARATUS FOR PROCESSING PFC

BACKGROUND OF THE INVENTION

1. Technical Field of the Invention

The present invention relates to methods and apparatuses for processing PFC (perfluorocarbon) and compounds thereof (HFC) in which part of PFC is replaced with hydrogen, and more particularly to methods and apparatuses for processing PFC that are used in a manufacturing process for semiconductor devices and liquid crystal apparatuses.

2. Prior Art

Conventionally, a semiconductor device that uses, for example, metal plugs has a structure in which contact holes are formed in a dielectric film and wirings above and below thereof are connected to one another through the contact holes, such that electrical circuits provided on both sides of dielectric film are connected to one another.

The semiconductor device having the structure described above is manufactured in the following manner. Namely, a first wiring is formed over a surface of a semiconductor substrate, and then a dielectric film of silicon oxide ($SiO_2$) is provided as an interlayer dielectric film. Contact holes are formed in the dielectric film.

Then, a second wiring layer is formed. In this instance, the first wiring layer and the second wiring layer are connected together through the contact holes. It is noted that the interlayer dielectric layer is normally formed by a chemical vapor deposition method (hereafter referred to as a "CVD" method).

In recent years, a plasma CVD method is often used. In the plasma CVD method, surplus products (deposits) are generated within the chamber in areas other than a wafer on which films are formed. The surplus products may possibly come off the chamber and fall onto the wafer, which may affect the yield in manufacturing ICs.

Accordingly, upon completion of each process, one method in which PFC is introduced into the vacuum chamber to thereby remove (clean) the remaining products is widely used.

Figure 4:
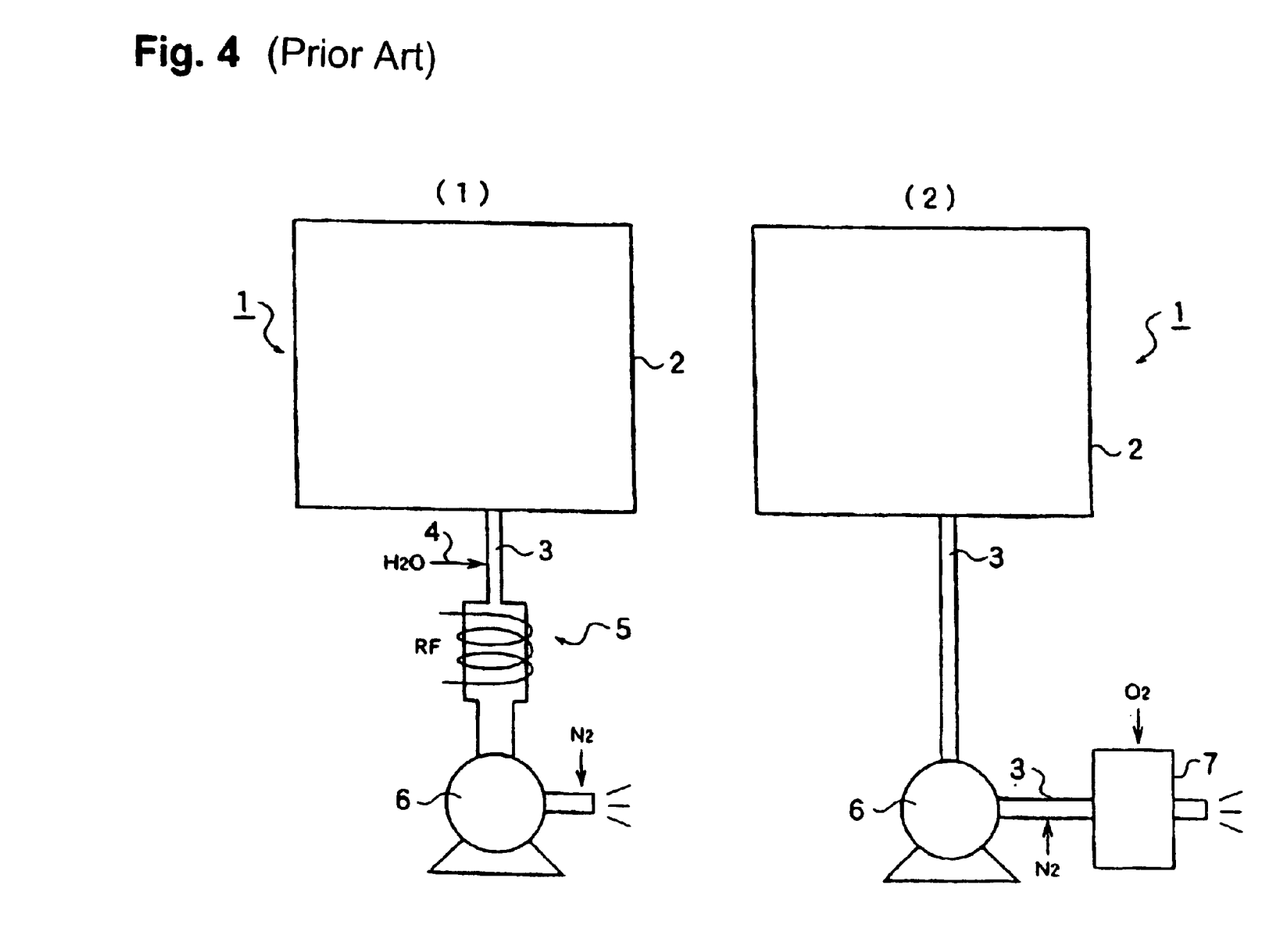
FIG. 4 shows a structure of a conventional apparatus for manufacturing semiconductor devices.

FIG. 4 shows a structure of a conventional apparatus for manufacturing semiconductor devices. The manufacturing apparatus 1 that removes the remaining products has a vacuum chamber 2 and a piping 3 installed in a succeeding stage of the vacuum chamber 2, as shown in FIG. 4 (1). A blowout mouth 4 that enables spraying water ($H_2O$), a plasma process section 5 and a vacuum pump 6 are connected to the piping 3 in a succeeding stage of the vacuum chamber 2, in order to prevent the PFC whose GWP (global warming power coefficient) is several thousands to several tens of thousand times greater than that of carbon dioxide from directly being discharged into the atmosphere.

In other words, after the cleaning, $H_2O$ is added to the PFC, and then a plasma process is conducted under a reduced pressure (in a vacuum), to generate carbon dioxide and hydrogen fluoride according to the following formula:

Then, the gas is returned through the vacuum pump 6 to the atmosphere.

It is noted that, since hydrogen fluoride has a strong acidity, it is sufficiently diluted by nitrogen gas or the like and then discharged into the atmosphere.

Referring to FIG. 4 (2), a vacuum pump 6 and an incineration chamber 7 are provided in a succeeding stage of the vacuum chamber 2 through a piping 3. The PFC, which is returned to the atmospheric pressure from the reduced pressure by the use of the vacuum pump 6, is introduced into the incineration chamber 7, and reacts with oxygen that is introduced simultaneously with the PFC in the incineration chamber 7 as follows:

By this reaction, the PFC that is used to clean the vacuum chamber 1 is processed, such that it is prevented from being directly discharged into the atmosphere.

However, the manufacturing apparatuses described above have the following problems. Namely, in the manufacturing apparatus shown in FIG. 4 (1), hydrogen fluoride is generated by the reaction between carbon tetrafluoride and water.

As described above, since hydrogen fluoride has a strong acidity, it is likely to oxidize structural parts (that are made of metal) of the vacuum pump 6 that is disposed in the succeeding stage of the plasma process section 5. Also, since the plasma process section 5 is placed under a reduced pressure (vacuum) similar to the vacuum chamber 2, it is difficult to perform maintenance and inspection works.

On the other hand, in the manufacturing apparatus shown in FIG. 4 (2), the PFC is thermodynamically stable and bonding among the molecules is strong. Therefore, the incineration temperature in the incineration chamber 7 is required to be over 1200 ° C. (more preferably, over 1400 ° C.). Furthermore, to securely accomplish the reaction between $CF_4$ and $O_2$, a long heating time is required. As a result, the structure of the incineration chamber 7 is complicated and a large amount of fuel is required.

Also, the incineration chamber 7 that satisfies the conditions described above (the heating temperatures and heating time) is generally large in size, and therefore, its processing capability is substantially large compared to the amount of the PFC that is used for the cleaning. Therefore, when the incineration chamber 7 is used for the reaction of the PFC, nitrogen gas is used to sufficiently dilute the PFC, and thereafter it is introduced into the incineration chamber 7. However, as the nitrogen gas is added to the PFC, it is likely that NOx may be generated during the incineration.

Furthermore, when the incineration temperature is low, the reaction intermediates may recombine to thereby re-create PFC, which would likely lower the decomposition efficiency.

In view of the problems of the conventional art described above, it is an object of the present invention to provide methods and apparatuses for processing PFC, which does not damage the vacuum pump or does not require an incineration process, and in which maintenance and inspection works are readily performed.

DESCRIPTION OF THE INVENTION

The present invention is made based on the knowledge that, when a plasma process is conducted under the atmospheric pressure, damages that may be inflicted on the vacuum pump are prevented, and when the PFC is reacted to generate harmless polymers, they are readily collected.

A method for processing PFC in accordance with a first embodiment of the present invention is a method for processing PFC that is used in a manufacturing process for semiconductor devices or the like. The method is characterized in that the PFC that is used under a reduced pressure is brought under the atmospheric pressure through a vacuum pump, then a reactive material is added to the PFC, and a plasma process is conducted for a mixed gas of the PFC and the reactive material to thereby generate a polymer with the PFC and the reactive material. The semiconductor devices or the like described above do not only represent semiconductor devices but also represent a wider concept including liquid crystal devices and a variety of light-emitting devices.

By the method for processing PFC in accordance with the first embodiment, the mixed gas, after being brought under the atmospheric pressure, is subject to a plasma process. Therefore, the plasma process is conducted in a succeeding stage of the vacuum pump. Accordingly, the reacted products after the plasma process are not transferred through the vacuum pump, and therefore the vacuum pump is prevented from being damaged by the reacted products. Also, since the section where the plasma process is conducted is set under the atmospheric pressure environment, maintenance and inspection works on the plasma process section can be readily conducted.

Moreover, when the PFC and a reactive material are reacted, incineration is not required, and therefore an incineration chamber is not required. Further, generation of NOx by the incineration or recombination of intermediates to regenerate PFC can be prevented.

Also, since the mixed gas is subject to a plasma process to thereby generate polymers, the process of PFC is completed by only collecting the polymers.

A method for processing PFC according to a second embodiment of the present invention is characterized in that the reactive material is gas of paraffin hydrocarbon or alcohol.

According to the method for processing PFC recited in the second embodiment, fluoride compound gas and paraffin-hydrocarbon gas are subject to a plasma process to cause a reaction shown below. In one embodiment, carbon tetrafluoride is used as the fluoride compound gas, and methane is used as the paraffin-hydrocarbon gas.

As shown in the reaction formula above, harmless polymer of fluoride risen is generated. Therefore, the process of PFC can be completed by merely collecting the polymer. Furthermore, although hydrogen fluoride having a strong acidity is generated with the polymer, the vacuum pump is prevented from being eroded by the hydrogen fluoride because the vacuum pump is disposed in a preceding stage.

Also, when alcohol is used as the reactive material, a reaction that provides a polymer similar to the one described above occurs, and a harmless fluoride resin is generated. Therefore, the process of PFC can be completed by merely collecting the polymer. Also alcohol is a liquid and easy to handle in, for example, transportation compared to gaseous body.

A method for processing PFC in accordance with a third embodiment of the present invention is a method for processing PFC that is used in a process for manufacturing semiconductor devices or the like. The method is characterized in that the PFC that is used under a reduced pressure is brought under the atmospheric pressure through a vacuum pump, then water and/or oxygen is added to the PFC, and a plasma process is conducted to decompose the PFC.

By the method for processing PFC in accordance with the third embodiment, the PFC, after being brought under the atmospheric pressure, is subject to a plasma process. Therefore, the plasma process is conducted in a succeeding stage of the vacuum pump. Accordingly, the reacted products after the plasma process do not pass through the vacuum pump, and therefore the vacuum pump is prevented from being damaged by the reacted products. Also, since the section where the plasma process is conducted is set under the atmospheric pressure environment, maintenance and inspection works on the plasma process section can be readily conducted.

Moreover, when the PFC is decomposed, incineration is not required, and therefore an incineration chamber is not required. Furthermore, generation of NOx by incineration or recombination of intermediates to regenerate PFC can be prevented.

An apparatus for processing PFC in accordance with a fourth embodiment of the present invention is an apparatus for processing PFC to be disposed in a succeeding stage of a vacuum pump that is connected to a vacuum chamber that is used in a process for manufacturing semiconductor devices or the like.

The processing apparatus includes a plasma process section that irradiates plasma to the PFC that is discharged under the atmospheric pressure through a vacuum pump, and a reactive material supply section that is disposed in a preceding stage of the plasma process section and adds a reactive material to the PFC to produce a mixed gas, wherein the mixed gas is subject to a plasma process under the atmospheric pressure to generate a polymer of the PFC and the reactive material.

By the apparatus for processing PFC in accordance with fourth embodiment, since the mixed gas, after being brought under the atmospheric pressure, is subject to a plasma process, the plasma process section is disposed in a succeeding stage of the vacuum pump. Accordingly, the reacted products after the plasma process are not transferred through the vacuum pump, and therefore the vacuum pump is prevented from being damaged by the reacted products. Also, since the section where the plasma process is conducted is set under the atmospheric pressure environment, maintenance and inspection works on the plasma process section can be readily conducted.

Moreover, since incineration is not required when the PFC and a reactive material are reacted, an incineration chamber is not required, and generation of NOx by the incineration or recombination of intermediates to regenerate PFC gas can be prevented.

Also, since the mixed gas is processed by the plasma process section to thereby generate polymers, the process of the PFC is completed by only collecting the polymers.

An apparatus for processing PFC according to a fifth embodiment of the present invention is characterized in that the reactive material is gas of paraffin hydrocarbon or alcohol.

According to the apparatus for processing PFC recited in the fifth embodiment, fluoride compound gas and the paraffin hydrocarbon gas or alcohol are subject to a plasma process to thereby form polymers. For example, carbon tetrafluoride is used as the fluoride compound gas, and methane is used as the paraffin-hydrocarbon gas. As a result, harmless polymer of fluoride resin is generated. Therefore, the process for PFC can be completed by merely collecting the polymer. Furthermore, although hydrogen fluoride having a strong acidity is also generated with the polymer, the vacuum pump is prevented from being eroded by the hydrogen fluoride because the vacuum pump is disposed in a preceding stage. Also, when alcohol is used as the reactive material, in addition to the effects described above, it is easy to handle in, for example, transportation because the alcohol is a liquid.

An apparatus for processing PFC in accordance with a sixth embodiment of the present invention is an apparatus for processing PFC to be disposed in a succeeding stage of a vacuum pump that is connected to a vacuum chamber that is used in a process for manufacturing semiconductor devices or the like.

The processing apparatus includes a plasma process section that irradiates plasma to the PFC that is discharged under the atmospheric pressure through a vacuum pump, and a reactive material supply section that is disposed in a preceding stage of the plasma process section and adds water and/or oxygen to the PFC, wherein the PFC that includes the water and/or oxygen is subject to a plasma process under the atmospheric pressure to decompose the PFC.

By the apparatus for processing PFC in accordance with the sixth embodiment, the PFC after being brought under the atmospheric pressure is subject to a plasma process. Therefore, the plasma process is conducted in a succeeding stage of the vacuum pump. Accordingly, the reacted products after the plasma process do not pass through the vacuum pump, and therefore the vacuum pump is prevented from being damaged by the reacted products. Also, since the section where the plasma process is conducted is set under the atmospheric pressure environment, maintenance and inspection works on the plasma process section can be readily conducted.

Moreover, since incineration is not required when the PFC is decomposed, an incineration chamber is not required. Furthermore, generation of NOx by incineration or recombination of intermediates to regenerate PFC can be prevented.

An apparatus for processing PFC according to a seventh embodiment of the present invention includes a cyclone collector provided in a succeeding stage of the plasma process section, such that the polymer can be collected by the cyclone collector. By the apparatus for processing PFC according to the seventh embodiment, circular movements can effectively separate the polymer from other gases that are discharged from the piping.

An apparatus for processing PFC according to an eighth embodiment of the present invention includes a pair of open/close type partition boards provided at the bottom section of the cyclone collector where the polymer deposits, to provide a double chamber structure at the bottom section, wherein deposition and collection of the polymer can be simultaneously conducted by open/close operation of the partition boards. In the apparatus for processing PFC according to the eighth embodiment, the bottom section has a double chamber structure formed by the partition boards. Accordingly, while the upper partition board is closed so that the polymer can be deposited over the upper partition board, the lower partition board is opened so that the already deposited polymer can be taken out from cyclone collector. Then, the lower side partition board is closed, and the upper side partition board is opened such that the polymer deposited on the upper side partition board drops onto the lower side partition board. By repeating these operations, the polymer can be taken out from the cyclone collector while the cyclone collector is being operated.

BEST MODES FOR CARRYING OUT THE INVENTION

A method and an apparatus for processing PFC in accordance with preferred embodiments of the present invention are described in detail below with reference to the accompanying drawings.

Figure 1:
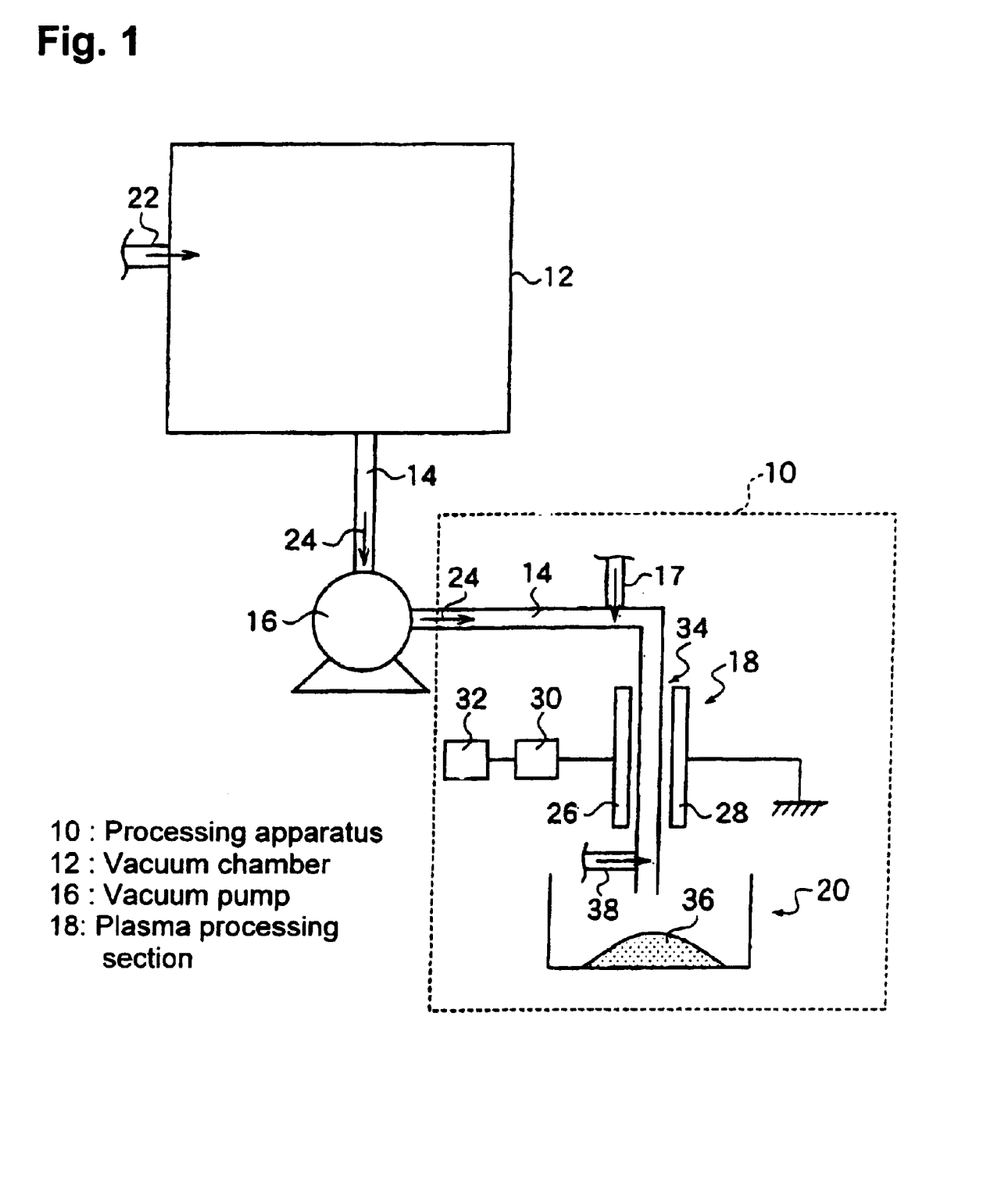
FIG. 1 shows a structure of an apparatus for processing PFC in accordance with one embodiment of the present invention.

FIG. 1 shows a structure of an apparatus for processing PFC in accordance with one embodiment of the present invention.

As shown in the figure, the apparatus for processing PFC 10 is provided in a succeeding stage of a vacuum pump 16 that is connected to a vacuum chamber 12. The processing apparatus 10 is formed from a piping 14 that is lead out from the vacuum chamber 12, a reactive gas introduction section 17 that is provided intermediate of the piping 14, a plasma process section 18, and a polymer collection section 20 that is connected to an end side of the piping 14.

The vacuum chamber 12 is used for conducting CVD for a semiconductor substrate (not shown). The semiconductor substrate is introduced in the vacuum chamber 12 where thin films such as polycrystal silicon films or silicon oxide films to be used as wirings or surface protection films can be formed. Also, an PFC introduction section 22 that enables introduction of PFC is connected to the vacuum chamber 12, such that remaining materials composed of reaction products can be removed (cleaned) from an internal surface of the vacuum chamber 12 after CVD is conducted.

The vacuum pump 16 that composes the processing apparatus 10 is provided to reduce an internal pressure of the vacuum chamber 12. The vacuum pump 16 can bring the degree of vacuum within the vacuum chamber 12 to a level sufficient for conducting CVD.

After cleaning of the vacuum chamber 12 is completed, the vacuum pump 16 sucks the PFC that is introduced in the vacuum chamber 12 out of the vacuum chamber 12. The PFC that is sucked out by the vacuum pump 16 is exhausted from the succeeding stage of the vacuum pump 16 into the atmospheric pressure (the flow of the PFC is indicated by an arrow 24 in the figure).

The reactive gas introduction section 17 that serves as a section for supplying a reactive material as described above is provided in the succeeding stage of the vacuum pump 16 in the piping 14 to enable introduction of a reactive gas that reacts with the PFC into the piping 14. Therefore, after passing the reactive gas introduction section 17 in the piping 14, the PFC and the reactive gas are mixed together to form a mixed gas that advances to a further succeeding stage.

The plasma process section 18 is provided in the succeeding stage of the reactive gas introduction section 17.

The plasma process section 18 is formed from a pair of a plate-shaped power supply electrode 26 and a placing electrode 28 opposing to one another about the piping 14. The power supply electrode 26 is connected to a high-frequency power supply 32 through a high voltage transformer 30. The plasma process section 18 is constructed in the manner described above such that, when the high frequency power supply 32 is operated, gaseous discharge is generated in a region 34 between the power supply electrode 26 and the placing electrode 28, which enables decomposition or reaction of the gas passing through the region 34.

The frequency provided by the high-frequency power supply 32 may preferably be about 13 MHz~20 MHz, and the output may be about 1~2 KW.

In other words, as described in Japanese laid-open patent application HEI 7-245192, an appropriate voltage is applied between the power source electrode 26 and the placing electrode 28 by the high-frequency power supply 32 through the high voltage transformer 30. Therefore, when the mixed gas passing through the piping 14 reaches the plasma process section 18, a discharge is generated by the voltage applied between the power supply electrode 26 and the placing electrode 28.

When a voltage is applied to the mixed gas composed of the PFC and the reactive gas, which causes a state in which energy is charged in the mixed gas, electrons in the atoms composing the PFC and the reactive gas fly out from the electron shells. The atoms, after the electrons are pulled out, become particles (ions) charged with a positive electricity, and the electrons that have flown out, which are originally charged with a negative electricity, become plasma. It is noted that the sum of electric charge of the electrons within the plasma is the same as the sum of electric charge of the atoms in magnitude with their signs being opposite to each other. Therefore, it goes without saying that they are generally electrically neutral as a whole.

Since the electrons in the plasma are light compared to the atoms, the electrons are more likely to receive energy by the applied voltage, and therefore, they can move faster compared to the atoms. Therefore, once the plasma is generated, the electrons therein have a larger amount of energy, such that the PFC itself or the reactive gas itself is decomposed by the energy.

Elements composing the PFC and the reactive gas that are decomposed by the process described in the above-mentioned reference are recombined in the plasma process section 18 to form a polymer. The polymer collection section 20 is provided in the succeeding stage of the plasma process section 18, so that the polymer 36 that is discharged from an end opening section of the piping 14 can be collected. Also, a nitrogen gas introduction section 38 is provided in the end opening section of the piping 14. Nitrogen gas is introduced through the nitrogen gas introduction section 38 into the piping 14 to dilute gases generated when the polymer 36 is generated in the plasma process section 18.

A polymerization process for PFC using the apparatus for processing PFC 10 thus constructed is described below.

The vacuum pump 16 is operated to discharge the PFC, which has been introduced in the vacuum chamber 12 through the PFC introduction section 22 and used to clean the vacuum chamber 12, into the atmospheric pressure in the succeeding stage of the vacuum pump 16 through the piping 14. In the present embodiment, the pressure of the vacuum chamber is set at 0.27~0.67 Pa (2~5 mTorr), and carbon tetrafluoride ($CF_4$) is used as the PFC in accordance with the present embodiment.

Passing through the vacuum pump 16, the carbon tetrafluoride is brought under the atmospheric pressure. When it passes through the reactive gas introduction section 17, it is mixed with the reactive gas such that a mixed gas including the reacting gas is formed. In accordance with the present embodiment, methane ($CH_4$) is used as the reactive gas, and the methane is supplied in a sufficient quantity with respect to the amount of the carbon tetrafluoride, such that a polymerization reaction of the carbon tetrafluoride can be securely achieved.

The mixed gas that includes carbon tetrafluoride and methane is introduced into the plasma process section 18. As described above, in the plasma process section 18, gaseous discharge is generated in the region 34 by the high-frequency power supply 32. Therefore, as the mixed gas that moves in the direction of the arrow 24 within the piping 14 is introduced in the region 34 of the plasma process section 18, gaseous discharge is also generated in the mixed gas. Due to the gaseous discharge of the mixed gas, the following reaction occurs.

When the plasma process is conducted in this manner, harmless polymer 36 of fluoride risen is generated. Therefore, the polymer 36 can be readily collected as the polymer 36 is discharged from the end of the piping 14 onto the polymer collection section 20. Furthermore, although HF having a strong acidity is generated when the polymer 36 is generated, the HF is diluted by nitrogen gas that is introduced from the nitrogen gas introduction section 38 provided near the end opening section of the piping 14 and then discharged into the atmosphere. In this manner, although HF having a strong acidity is generated, it is generated in a succeeding stage of the vacuum pump 16, and therefore the vacuum pump 16 is prevented from being damaged.

In accordance with the embodiment of the present invention, tetrafluoride is used as the PFC. However, the present invention is not limited to this embodiment, and for example, $C_4F_8$, $C_2F_6$ (i.e., fluoride compound gases) can be used. Further, methane is used in as the reactive gas. However, the present invention is not limited to this embodiment, and for example, $C_2H_6$, $C_3H_8$ and $C_4H_{10}$ or $CH_3OH$ and $C_2H_5OH$ (i.e., paraffin hydrocarbon gases or alcohol) can be used.

In accordance with the present embodiment, the polymer collection section 20 is provided at the end section of the piping 14, and the polymer 36 discharged from the piping 14 is collected by the polymer collection section 20. However, the present invention is not limited to this embodiment and the polymer 36 can be collected by any other method.

Figure 2:
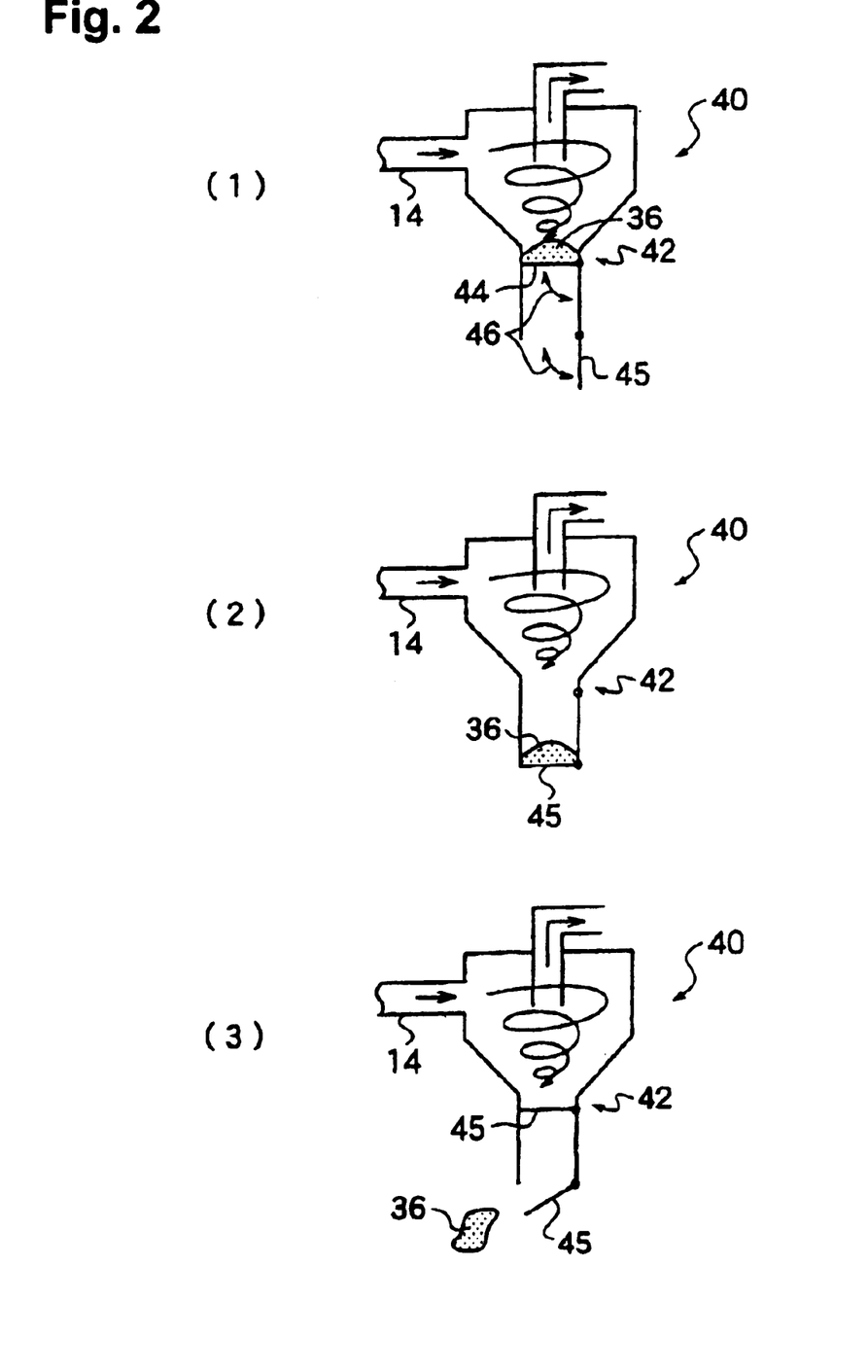
FIG. 2 shows an illustration to describe an operation when a cyclone collector is used as a polymer collection section 20.

FIG. 2 shows an illustration to describe an operation when a cyclone collector is used as the polymer collection section 20. As shown in FIG. 2 (1), the end section of the piping 14 is connected to a body portion of the cyclone collector 40, such that airflow flowing through the piping 14 can have circular movements in the cyclone collector 40. An upper partition board 44 and a lower partition board 45 are provided at a bottom section 42 of the cyclone collector 40 in a manner to partition the bottom section 42. The partition boards are mounted through hinge structures and can be moved in directions indicated by arrows 46 in the figure.

In the cyclone collector 40 thus constructed, as shown in FIG. 2 (1), first, the upper partition board 44 is closed, and the polymer 36 separated by the circular movements is deposited on the upper partition board 44. When the polymer 36 is sufficiently deposited on the upper partition board 44, the lower partition board 45 is closed and the upper partition board 44 is opened, such that the polymer 36 deposited on the upper partition board 44 is transferred onto the lower partition board 45. This state is shown in FIG. 2 (2).

When the polymer 36 is deposited on the lower partition board 45 in the manner described above, the upper partition board 44 is closed and the lower partition board 45 is opened, as shown in FIG. 2 (3), such that the polymer deposited on the upper surface of the lower partition board 45 is discharged outside the cyclone collector 40.

By repeating the operations shown in FIGS. 2 (1)–2 (3), collection of the polymer 36 by the cyclone collector 40 and recovery of the polymer 36 can be simultaneously conducted. As a result, the processing apparatus 10 is not required to stop at each time the polymer 36 is collected, and therefore the processing efficiency can be improved.

Figure 3:
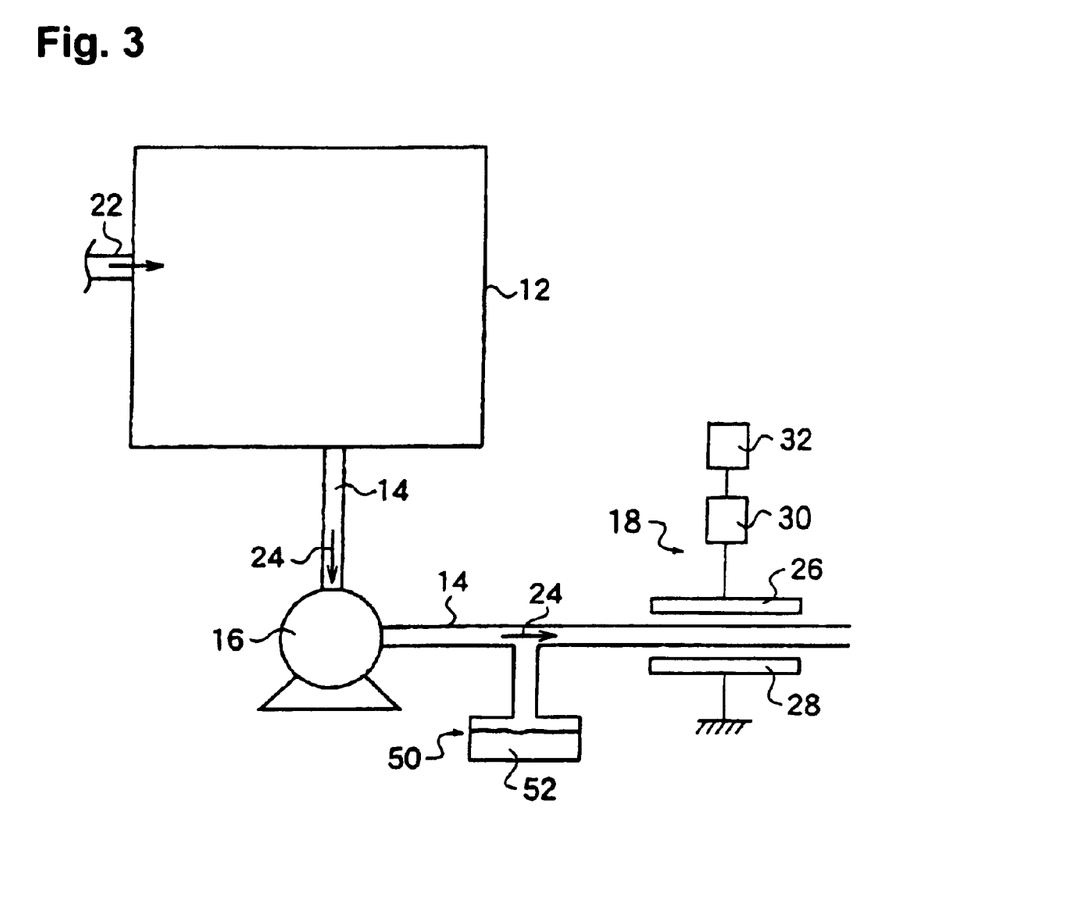
FIG. 3 shows a structure of an example in which an apparatus for processing PFC in accordance with an embodiment of the present invention is applied.

FIG. 3 is an explanatory view of a structure in which the PFC processing apparatus in accordance with one embodiment of the present invention is applied. As shown in the figure, a processing apparatus has a vacuum chamber, a vacuum pump and a plasma process section that have the same structures as those of the processing apparatus 10. Therefore, the same reference numerals as those used for the processing apparatus 10 are used, and the description thereof in the present example is omitted.

In this example, a bubbling apparatus 50 is connected intermediate of the piping 14, and water 52 that is reserved in the bubbling apparatus 50 is bubbled, such that water vapor is introduced into the piping 14. In this manner, water is added to carbon tetrafluoride that moves through the piping 14, and the water and carbon tetrafluoride are introduced into the plasma process section 18. As a result, the following reaction is obtained.

$$CF_4 + 2H_2O \rightarrow CO_2 + 4HF$$

In the manner described above, water is added to the carbon tetrafluoride and the plasma process is conducted, such that carbon dioxide and hydrogen fluoride can be obtained and the PFC is decomposed. It is noted that, in the processing apparatus 48 of the present example, the plasma process section 18 is provided in the succeeding stage of the vacuum pump 16. Accordingly, it goes without saying that, even when the hydrogen fluoride having a strong acidity is generated, the vacuum pump 16 can be prevented from being damaged. Also, although in the present example, water is added to the carbon tetrafluoride, oxygen may be added, such that carbon dioxide and fluoride gases are obtained.

What is claimed is:

1. A method for processing PFC that is used in a process for manufacturing electronic devices, the method is characterized in that the PFC that is used under a reduced pressure is brought under atmospheric pressure through a vacuum pump, then a reactive material is added to the PFC, and a plasma process is conducted for a mixed gas composed of the PFC and the reactive material to thereby generate a polymer with the PFC and the reactive material.

2. A method for processing PFC according to claim 1, wherein the reactive material is gas of paraffin hydrocarbon or alcohol.

3. A method for processing PFC according to claim 1, wherein the reactive material is an alcohol.

4. A method for processing PFC according to claim 1, wherein the plasma process generates a reaction product including the polymer, and controlling the flow of the reaction product so that at least a portion of the reaction product flows in a circular motion.

5. A method for processing PFC according to claim 1, wherein the plasma process generates a reaction product including the polymer, and controlling the flow of the reaction product so that at least a portion of the reaction product flows in a circular motion in a cyclone region of a chamber, and wherein first and second partition doors are adapted to be opened and closed, wherein the second partition door is separated from the cyclone region of the chamber by the first partition door when the first partition door is closed.

6. A methods for processing PFC according to claim 5, wherein the reaction product is controlled so that the polymer in the reaction product accumulates on the first partition door when the first partition door is closed, and wherein the polymer in the reaction product accumulates on the second partition door when the first partition door is opened and the second partition door is closed.

7. A method for processing PFC according to claim 5, comprising:
    closing the first partition door and accumulating the polymer in the reaction product on the first partition door;
    opening the first partition door while the second partition door is closed and then transferring the polymer accumulated on the first partition door to the second partition door;
    closing the first partition door and then opening the second partition door and removing the transferred polymer from the second partition door.

8. A method for processing PFC according to claim 7, further comprising generating reaction product and accumulating polymer on the first partition door during the opening the second partition door and removing the transferred polymer from the second partition door.

9. A method for processing a fluoride compound gas that is used in a device manufacturing process at below atmospheric pressure, comprising:
    after the fluoride compound gas is used at below atmospheric pressure, delivering the fluoride compound gas to a region at atmospheric pressure;
    adding an alcohol to the fluoride compound gas at atmospheric pressure;
    performing a plasma process on the fluoride compound gas and the alcohol at atmospheric pressure and generating a reaction product including a polymer.

10. A method of processing a fluoride compound gas according to claim 9, wherein the alcohol includes a gas selected from the group consisting of $CH_3OH$ and $C_2H_5OH$.

11. A method for processing a fluoride compound gas according to claim 10, wherein the fluoride compound gas is selected from the group consisting of $CF_4$, $C_2F_6$, $C_4F_8$ and $S_6$.

12. A method for processing a fluoride compound gas according to claim 9, wherein the fluoride compound gas consists of fluorine and a material selected from carbon and silicon.

13. A method for processing a fluoride compound gas according to claim 9, further comprising positioning the reaction product in a chamber and controlling the flow of the reaction product so that at least a portion of the reaction product flows in a circular motion in the chamber.

14. A method for processing a fluoride compound gas according to claim 9, wherein the chamber includes a cyclone region, wherein at least a portion of the reaction product is controlled so that it flows in a circular motion in the chamber, and wherein first and second partition doors are adapted to be opened and closed, wherein the second partition door is separated from the cyclone region of the chamber by the first partition door when the first partition door is closed.

15. A method for processing a fluoride compound gas according to claim 14, wherein the reaction product is controlled so that the polymer in the reaction product accumulates on the first partition door when the first partition door is closed, and wherein the polymer in the reaction product accumulates on the second partition door when the first partition door is opened and the second partition door is closed.

16. A method for processing a fluoride compound gas according to claim 14, comprising:

closing the first partition door and accumulating the polymer in the reaction product on the first partition door;

opening the first partition door while the second partition door is closed and then transferring the polymer accumulated on the first partition door to the second partition door;

closing the first partition door and then opening the second partition door and removing the transferred polymer from the second partition door.

17. A method for processing a fluoride compound gas according to claim 16, further comprising generating reaction product and accumulating polymer on the first partition door during the opening the second partition door and removing the transferred polymer from the second partition door.

18. A method for processing a fluoride compound gas that is used in a device manufacturing process, comprising:

using a fluoride compound gas selected from the group consisting of $CF_4$, $C_2F_6$, $C_4F_8$ and $SF_6$ during a process for manufacturing under a reduced pressure using a vacuum pump at least one of a semiconductor device, a liquid crystal device, or a light emitting device;

after using the fluoride compound gas, transferring the fluoride compound gas through the vacuum pump to an atmospheric pressure region;

adding at least one reactive material gas selected from the group consisting of $CH_3OH$ and $C_2H_5OH$ to the fluoride compound gas;

performing a plasma process on the fluoride compound gas and the reactive material gas at atmospheric pressure and generating a reaction product including a solid polymer.

19. A method for processing a fluoride compound gas according to claim 18, wherein the fluoride compound gas is selected from the group consisting of $CF_4$, $C_2F_6$, $C_4F_8$.

20. A method for processing a fluoride compound gas according to claim 18, wherein the fluoride compound gas is $SF_6$.

* * * * *